United States Patent [19]
Brown et al.

[11] Patent Number: 5,436,937
[45] Date of Patent: Jul. 25, 1995

[54] MULTI-MODE DIGITAL PHASE LOCK LOOP

[75] Inventors: David L. Brown, Miami; Paul D. Marko, Ft. Lauderdale, both of Fla.

[73] Assignee: Motorola, Inc., Schaumburg, Ill.

[21] Appl. No.: 11,926

[22] Filed: Feb. 1, 1993

[51] Int. Cl.[6] .................................. H03D 3/24
[52] U.S. Cl. ..................... 375/376; 375/368; 375/259
[58] Field of Search ................ 375/120, 119, 118, 81, 375/114, 116, 111; 370/105.1; 328/133, 155; 455/260; 379/58; 331/DIG. 2, 1 R, 25

[56] References Cited

U.S. PATENT DOCUMENTS

| | | | |
|---|---|---|---|
| 3,983,498 | 9/1976 | Malek . | |
| 4,574,243 | 3/1986 | Levine . | |
| 4,780,844 | 10/1988 | Keller | 375/120 |
| 5,055,802 | 10/1991 | Hietala et al. . | |
| 5,093,632 | 3/1992 | Hietala et al. . | |
| 5,095,498 | 3/1992 | DeLuca et al. | 375/119 |
| 5,097,489 | 3/1992 | Tucci | 375/120 |
| 5,182,761 | 1/1993 | Beyer et al. | 375/119 |
| 5,259,004 | 11/1993 | Nakayama | 370/105.1 |
| 5,271,040 | 12/1993 | Clark | 375/120 |

OTHER PUBLICATIONS

CT2 Common Air Interface Version 1.1, 6/30/91, 188 pages, "Common air interface specification to be used for the interworking between cordless telephone apparatus in the frequency band 864.1 MHz to 868.1 MHz, including public access services" European Telecommunications Standards Institute, Valbonne Cedez France.

*Primary Examiner*—Stephen Chin
*Assistant Examiner*—Hai H. Phan
*Attorney, Agent, or Firm*—Daniel K. Nichols

[57] ABSTRACT

A multi-mode PLL circuit (100) includes an early/late bit transition accumulator (108) for accumulating the number of incoming bit transitions which are early or late. This allows for PLL (100) to provide adjustments based on a predetermined number of accumulated early/late accumulations or based on an average of early/late transitions over a predetermined period of time. PLL (100) further includes a frequency offset circuit (200) which includes a frequency error accumulator which is used to maintain a frequency offset history and to control the loop frequency. This allows for very narrow band operation of the first order digital PLL while maintaining stable operation.

13 Claims, 3 Drawing Sheets

MULTI-MODE DIGITAL PHASE LOCK LOOP

TECHNICAL FIELD

This invention relates generally to the field of phase-lock-loops (PLL) and more specifically to a digital PLL which can operate in a plurality of different operating modes.

BACKGROUND

Loss of synchronization during communications in a digital communication system such as a second generation cordless telephone system (CT2) creates unwanted problems to system users. Loss of synchronization can be induced by selective multipath fading, flat fading, weak signals, or other well known communication phenomena.

In a CT2 system, a handset (also known as a cordless portable part or CPP) initiating a call to a base station (cordless fixed part or CFP) asynchronously transmits on one available channel of the handset's transceiver, which corresponds to a radio frequency (RF) channel in the base station. In a typical CT2 communication system, the communication protocol standard includes four main burst structures, called multiplex 3 (MUX 3), multiplex 2 (MUX 2) and multiplex 1 (MUX 1) which is further subdivided into either multiplex 1.4 or 1.2 (MUX 1.4 or MUX 1.2). MUX 3 is utilized mainly for communication link initiation (link establishment and re-establishment) from a CPP to a CFP. MUX 2 is used primarily for communication link establishment and for link initiation from the base station (CFP). The MUX 1 burst structures (MUX 1.2 and MUX 1.4) are used primarily for voice/data communications, signaling information, and control messages from the CPP (portable) and CFP (base).

Both MUX 3 and MUX 2 contain synchronization patterns which provide frame alignment in both the CFP and CPP. MUX 1 does not include a synchronization pattern and requires precise tracking of the receive data transitions in order to maintain frame synchronization.

For a better understanding of the overall CT2 system communication protocol, one is referred to a publication entitled, "Common air interface specification to be used for the interworking between cordless telephone apparatus in the frequency band 864.1 MHz to 868.1 MHz, including public access services", Version 1.1, dated 30th June 1991, which is published by the European Telecommunications Standards Institute and is hereby incorporated by reference.

In today's digital systems, especially in systems which provide no synchronization patterns, there is a need for a PLL which can handle both clock recovery of the received data and can withstand weak signals, interference, multi-path fading conditions, or other well known problems.

DETAILED DESCRIPTION OF THE PREFERRED EMBODIMENT

Figure 1:
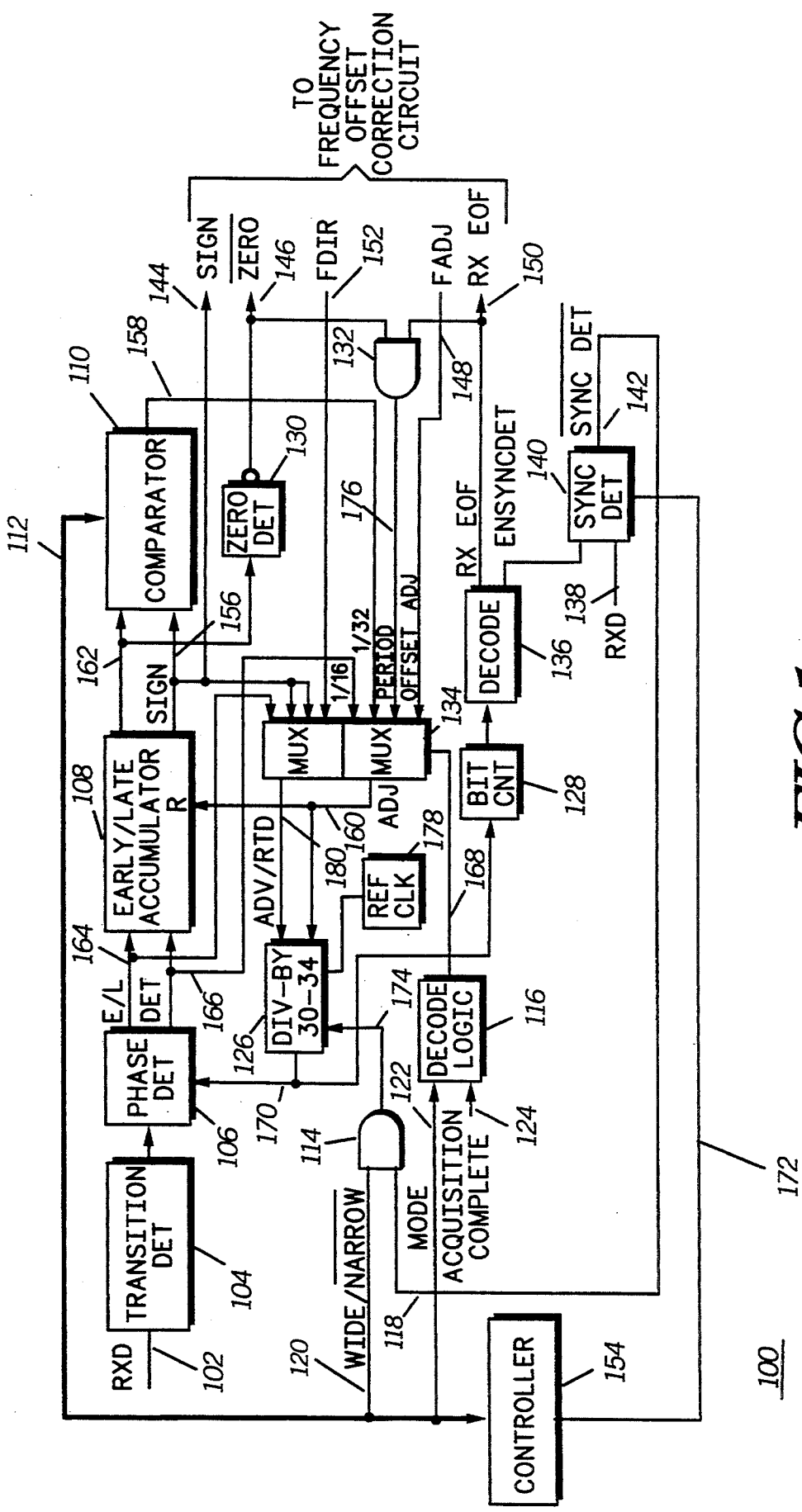
FIG. 1 is a diagram of a digital phase-lock-loop (PLL) in accordance with the present invention.

Referring now to the drawings and more specifically to FIG. 1, there is shown a diagram of a multimode digital phase lock loop (PLL) 100 in accordance with the present invention. Multimode digital phase lock loop 100 provides four different modes for acquiring and maintaining synchronization. These modes are as follows:

mode 1: provides a 1/16th bit time adjustment to the incoming bit transitions based on when the bit transitions occur relative to the internal PLL phase (e.g., are the bit transitions early or late relative to the PLL phase) prior to detection of a synchronization character by the telephone handset's receiver circuitry;

mode 2: provides for 1/32 bit time adjustments based on a predetermined number of accumulated bit transitions having been received in either an early or late direction relative to the internal PLL phase. Mode 2 is entered after detection of a synchronization character in the incoming digital data;

mode 3: provides for 1/32 bit time adjustments based on average early/late transitions over a given period of time (predetermined number of received bits or receive frames); and mode 4: provides for periodic adjustments based on the calculated frequency offset acquired in mode 3 between the two radio end points (e.g., a CT2 base station and a portable unit). Further, mode 4 provides additional tracking of incoming bit transitions to provide long term frequency offset correction.

The first three modes will be described while referring to FIG. 1, while the fourth mode will be described in relation to FIG. 2. The main adjustment values under the control of controller 154 are a transition adjust threshold value sent to comparator 110 via bus 112, a wide/narrow bandwidth adjustment value sent to logic gate 114 via line 120, and a mode selection value sent via line 122 to decode logic 116. The mode selection signal informs PLL 100 in which of the four previously mentioned modes the PLL will operate in.

The transition adjustment threshold value is an absolute value sent via bus 112 by controller 154 to comparator 110. The transition adjustment threshold value allows for the programmability of the number of bit transitions in either the positive or negative directions which are referenced to the internal PLI phase on which a bit adjustment can be made. The bit adjustment is made by the PLL circuit in the direction (either positive or negative) based on the sign bit coming from the sign output 156 of the early late accumulator 108 and of the output (zero bar) 146 of zero detector 130 being false (value not equal to zero). The early/late accumulator 108 is comprised of one internal up/down counter which counts up for early bit transitions (a bit transition occurring before the internal PLL phase), and counts down for late bit transitions (transitions occurring after the internal PLL phase). The sign information coming from sign output 156 is sent to comparator 110.

The wide/narrow bandwidth output 120 coming from controller 154 allows for an over-ride of narrow bandwidth operation when output 120 is set to a positive (high) state if the SYNC detector 140 has been reset via line 172 by controller 154. This causes an adjustment of 1/16th of a bit on each bit transition coming from RXD input line 102. When the PLL is placed in a narrow bandwidth, one of the other 3 PLL modes previously mentioned are used (modes 2-4).

Mode input line 122 allows for controller 154 to select one of the four operating modes previously discussed. Controller 154 can be a microprocessor or microcontroller as known in the art which operates using appropriate control software stored in either internal and/or external memory. The RXD line input signal comes from a center slicer circuit (not shown) which is part of the radio transceiver 302 (shown in FIG. 3). PLL 100 is used to both recover clock synchronization and received data coming from transceiver 302 (shown in FIG. 3). A conventional reference clock 178 such as a crystal reference or other type of oscillator circuit provides a reference clock signal to divider circuit 126 at preferably 32 times the received bit rate and to all the other register devices making up PLL 100 (connections from reference clock 178 to the other circuits not shown in order to simplify FIG. 1). Clock 178 and divider circuit 126 together form a clock means for PLL circuit 100 and frequency offset correction circuit 200.

The divide by 30–34 counter 126 normally operates in a divide by 32 mode when no adjustments are being made. Recovered clock output 170 from divide-by-counter 126 provides the bit timing at the data rate expected to a phase detector means such as phase detector 106 in order to determine the phase error from RXD input 102. Phase detector 106 only allows one bit transition to be detected within a bit time, thus preventing phase adjustments on unwanted signals.

A brief description of the operation of PLL 100 begins by first applying power and initializing all of the circuits within PLL 100. Once all of the circuits are initialized, the divide-by 30–34 divider 126 is set to a 1/16th bit adjustment mode via a signal provided by output 174 of logic gate 114 which is controlled by input signal 120. Signal 174 informs divider 126 whether it will be dividing in a divide-by 32±2 or in a divide-by 32 ±1 mode. Advance/retard signal 180 will determine on each mode whether to increase of decrease the divide ratio. Controller 154 will set the mode of operation of the PLL 100 to mode 1 by sending the appropriate MODE value via line 122 and sending to the wide/narrow input 120 of gate 114 a value representing the wide bandwidth mode. Controller 154 will also send a transition adjustment value via bus 112 to comparator 110 which will provide a low pass filter function which automatically be switched in after the SYNC character is detected by SYNC detector 140. This causes the divide-by counter 126 to adjust in 1/16th of a bit increments based on the incoming data while the PLL circuit 100 remains in mode 1 until a SYNC character is detected. From a CT2 system standpoint, mode 1 is entered into by PLL 100 when the radio that PLL 100 is a part of is scanning for a synchronization pattern or when the radio handset is scanning for a MUX 2 poll from the CT2 base station.

In mode 1, PLL 100 will begin receiving incoming data and bit transitions via RXD input line 102. The incoming bit transitions are detected through transition detector 104 while phase detector 106 determines the phase of the incoming bits. Once a bit transition is detected, the information is sent via line 166 to multiplexer circuit (MUX) 134. Early or late bit transition phase information is also sent to MUX 134 via line 164. Mux 134 includes a pair of 4 to 1 multiplexers. One multiplexer is responsible for the adjustment signal on line 160 while the other mux is responsible for the advance/retard information sent via line 180. The information received by MUX 134 forces MUX 134 to send an adjustment signal (ADJ) via line 160 and an advance/retard signal 180 to the divide-by counter 126 in order to advance or retard divider 126 by 1/16th or 1/32nd of a bit in the direction the transition was detected in relationship to the phase. For example, in the case were the incoming bit transitions are early by ½ a bit, the alignment of the incoming data will preferably occur within eight incoming bit transitions since in each transition the divide-by counter 126 is adjusted by 1/16th of a bit in the direction of the bit transition. The direction (sign) in which the transition occurs is determined by phase detector 106 and is provided to MUX 134 via line 164. In mode 1, early/late accumulator 108 is bypassed. Divider 126 provides a recovered clock output 170 to phase detector 106 and to bit counter 128.

During clock recovery, SYNC detector circuit 140 is monitoring for a synchronization character coming in from the RXD (receive data) input line 138 which is coupled to input line 102. When the SYNC character is received, the output of the synchronization detector (SYNC DET bar) 142 goes low (e.g., zero volts) indicating a synchronization character has been detected by detector 140. Once the SYNC character is detected, the low signal on output 142 remains low and is sent to logic gate 114 via input line 118, causing PLL 100 to automatically switch into a narrower loop of operation (mode 2 which is a first order mode).

In mode 2, the PLL's narrower loop of operation will be based on a predetermined number of accumulated bit transitions occurring in either a positive or negative direction. In other words, no adjustment will occur until a predetermined number of bit transitions have occurred, unlike in mode 1 where adjustments are made on a transition by transition basis.

The narrower loop of operation provided by mode 2 is implemented by allowing early/late transition accumulator 108 to be adjusted on each of the incoming transitions. As previously discussed, controller 154 has set the transition adjust threshold which is sent via bus 112 to comparator 110 in order to provide a low pass filter function which will automatically be switched in after the SYNC (synchronization) character is detected.

Based on the data provided by phase detector 106 and transition detector 104, via the early/late phase output 164 and transition detector output 166, accumulator 108 generates a signed (magnitude) value on output line 162 as well as a sign value on output line 156. This information is then sent to comparator 110 which internally converts the signed value to an absolute value and compares it to the transition threshold value 112. Once the output on output line 162 equals the value of the transition adjustment value stored in comparator 110, comparator 110 provides an output signal at output 158 which is sent to mux 134. Mux 134 in turn generates an adjustment signal on output line 160 which causes divide-by counter 126 to either add or subtract 1/32nd of a bit depending on the sign bit provided by early/late accumulator 108 at line 156.

Once the adjustment signal is sent via output line 160 to divider 126 in mode 2, the early/late accumulator 108 is cleared (reset) and the PLL circuit is assumed to be in phase alignment until a new accumulation error is detected, at which time another 1/32nd bit adjustment is made. Provided an uncorrupted signal is always received correctly and a suitable number of bit transitions exist within the data, PLL 100 will remain locked to the incoming received signal.

In a time division duplex communication system, such as a CT2 system, where a communication device spends its time cycling between receive and transmit cycles, once synchronization is established, mode 3 provides for a periodic adjustment of the PLL at the end of each receive frame. In mode 3, the entire received frame is accumulated in the early/late accumulator 108. At the end of the received frame, the early/late value is verified to be non-zero by zero detection circuit 130. If the value is determined to be equal to zero, then the incoming bit transitions over the entire received frame averaged out and no adjustment is necessary. The output (zero bar) 146 of zero detector circuit 130 is coupled to "AND" gate 132 to block adjustment from the receive end-of-frame (RX EOF) line 150 if the early/late accumulator value is equal to zero at the end of the receive frame. If the value is determined to be a non-zero value, then the adjustment is made at the end of the receive window by preferably making a 1/32nd of a bit adjustment in the direction of the early/late accumulators sign bit. The next bit adjustment in this mode does not occur until the end of the next receive frame. The end of each frame is determined by bit counter 128 which counts the number of incoming bits. The output of bit counter 128 is sent to decoder 136 which determines when RX EOF is reached (e.g., once a predetermined number of bits which make up each data frame is received). Decoder 136 sends the RX EOF signal from output 150 to gate 132 and to the frequency offset correction circuit of FIG. 2 when the end-of-frame is reached. When a non-zero value is sent via zero detector 130 and a RX EOF is sent via decoder 136, gate 132 sends a signal via output 176 to mux 134 which informs mux 134 that an adjustment must be made. Mux 134 then sends an ADJ signal via line 160 and an advance/retard signal via line 180 to divider 126 which in turn makes a 1/32nd bit adjustment in the direction of the sign bit as sent via advance/retard line 180.

Figure 2:
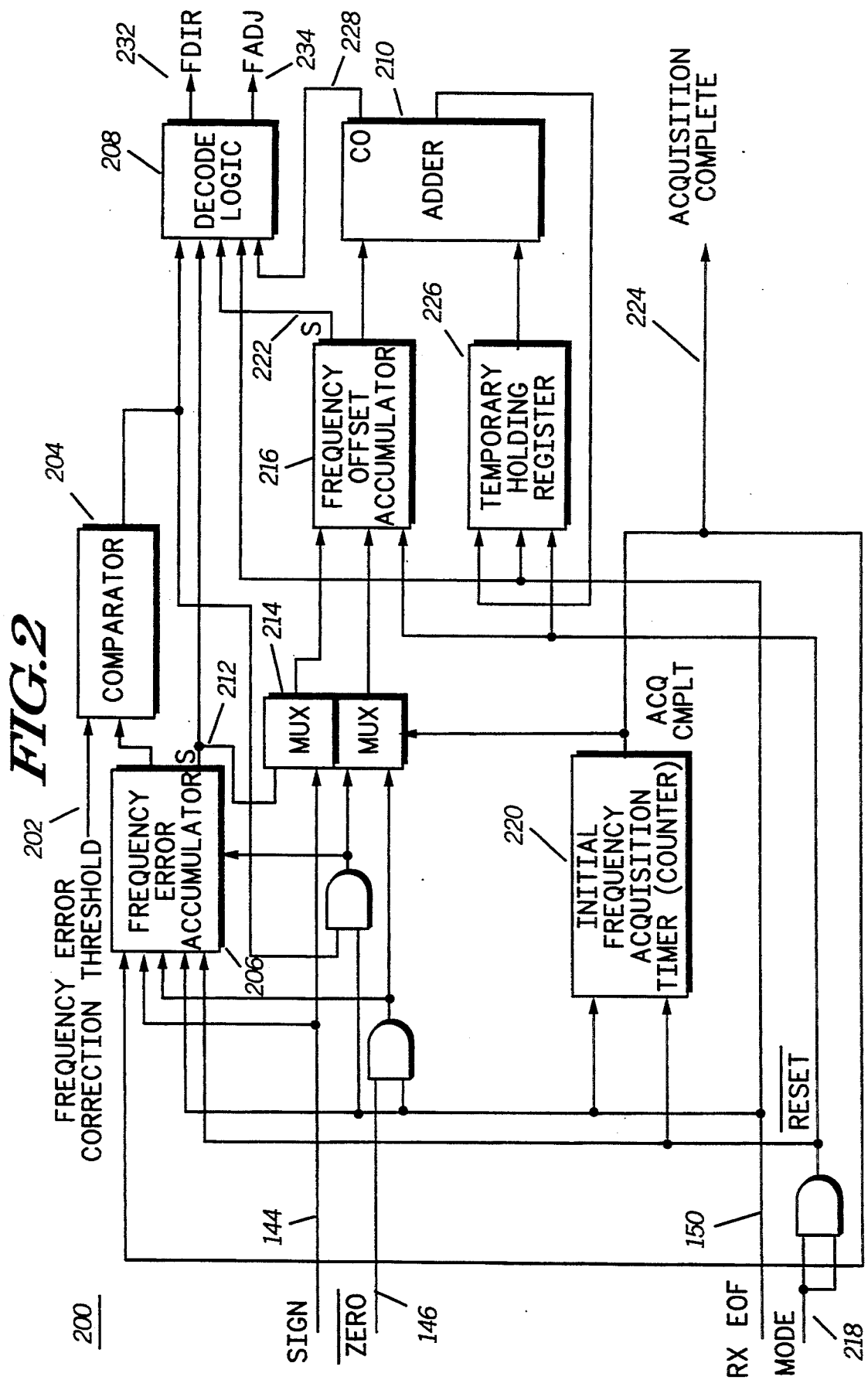
FIG. 2 is a diagram of a frequency correcting circuit for use with the PLL of FIG. 1 in accordance with the present invention.

Referring now to FIG. 2, there is shown a diagram of a frequency correcting circuit 200 for use with the PLL circuit of FIG. 1. A frequency error correction threshold value is sent from controller 154 (shown in FIG. 1) to a comparison means such as comparator 204 via input 202. The frequency error correction threshold value is used to set a threshold level at which point an error has accumulated in one direction and the frequency offset needs to be corrected. The mode input 218 accepts the mode change signal from controller 154 similar to that received by PLL 100. Frequency correcting circuit 200 remains initialized when it is not operating in mode 4. Once mode 4 is selected, frequency correcting circuit 200 becomes active and forces PLL 100 into mode 3 which is the periodic adjustment mode which was previously discussed above.

A data frame counter means such as initial frequency acquisition timer (counter) 220 counts the duration of 256 incoming receive frames as each end of frame signal is sent via RX EOF line 150. In the preferred embodiment counter 220 is counting for 256 received frames although the number of incoming frames which are counted by the counter can be adjusted to meet specific system requirements. During this initial period, a first up/down counter means such as frequency offset accumulator 216 monitors the sign input 144 and zero bar input 146 coming from PLL circuit 100. At the end of each receive frame, the initial frequency acquisition timer 220 is incremented and the frequency offset accumulator 216 is adjusted via MUX 214 in the direction indicated by the sign bit coming from PLL 100. If a zero value is detected coming from PLL 100, then no adjustment is made to the frequency offset accumulator 216. It is important to note that the periodic adjustment discussed above in relation to mode 3 is taking place in PLL 100 helping keep the communication link between the CT2 base station and the handset synchronized while at the same time that frequency correction circuit 200 is undergoing initialization into mode 4.

During the initial acquisition period, both the incoming received data and/or the signal quality of the received signal is monitored to guarantee correct frequency offset calculations. Signal quality measurements can be made using any of a number of known signal quality measurement circuits (not shown). In the event data having errors is detected in the received signal during initialization, PLL 100 is placed back into mode 2 (1/32nd bit adjustment after a predetermined number of bit transitions have occurred) or mode 3 in order to correct for any offset error. After a predetermined period of time has elapsed, PLL 100 is then placed back into mode 4.

After the end of the initial acquisition period, the output of the initial frequency acquisition timer 224 (labeled Acquisition complete) is set, forcing PLL circuit 100 via input 124 in FIG. 1 to receive its frequency correction information from frequency correction circuit 200. The acquisition complete output 224 is coupled to input 124 of decode logic circuit 116 shown in FIG. 1. Upon receiving the acquisition complete signal at input 124, decode logic circuit 116 sends a signal via output 168 which informs mux 134 that the adjustments will now be coming from circuit 200. At this point, no additional mode 3 adjustments are performed. In the preferred embodiment the acquisition complete signal is sent via output 224 to mux 214 and decode logic circuit 116 (shown in FIG. 1) after 256 frames have been received, although the circuit can be set to trigger the acquisition complete signal after any number of frames are received. In addition, during initial acquisition in mode 4, the frequency offset accumulator 216 will not be adjusted by the frequency error accumulator 206 exceeding the frequency error correction threshold coming in on input 202.

At the end of each received frame after the first 256 data frames have been received, the absolute value of the frequency offset accumulator 216 is added by adder 210 to the value in the temporary holding register (up/down counter) 226 and the result is stored in the temporary holding register 226. During the initialization into mode 4, a reset signal is sent to temporary holding register 226 which clears any value stored in the register. If a carry out (CO) 228 from adder 210 which is preferably an 8 bit adder (used to correlate the number of bit transitions over the acquisition period as a fraction) occurs, then a 1/32nd of a bit adjustment is made in the direction indicated by the sign bit output 222 of the frequency offset accumulator 216. Frequency offset accumulator 216, temporary holding register 226, adder 210 and decode logic 208 act as an adjustment means for frequency offsetting PLL circuit 100 using the historical information gathered during the 256 frames period discussed above.

Since the frequency offset accumulator's value is not an infinite number, an error will exist. This is also true based on environmental conditions which can cause the clock of the CPP or CFP to drift. Due to these imperfections, it is required to provide a means of feedback into the frequency offset accumulator 216. This is accomplished by using a second counter means (second up/down counter) such as frequency error accumulator 206. Frequency error accumulator 206 acts as a low pass filter removing the possibility of oscillation from PLL 100. Frequency error accumulator 206 accumulates the sign bit and monitors for a non-zero value from PLL circuit 100. If the value received is non-zero, the frequency error accumulator 206 adjusts in the direction reflected by the sign signal coming from PLL circuit 100 via input 144 when RX EOF is reached. If the frequency offset could be calculated perfectly, then the frequency error would average out to zero. However, it is not guaranteed that the frequency offset will be calculated perfectly and the frequency error will need to be calculated.

When the absolute value of the frequency error accumulator 206 reaches the value of the frequency error correction threshold stored in comparator 204, two adjustments are made. First, the frequency offset accumulator 216 is adjusted to correct for the frequency offset error. The direction of the adjustment will be determined by the sign bit output 212 of frequency error accumulator 206. This adjustment will force the frequency back into alignment and will change the frequency offset adjustment rate established by the carry out 228 of adder 210 by 1/32nd of a bit adjustment every 256 frames.

Secondly, a 1/32nd of a bit adjustment is made to PLL circuit 100. Referring to FIG. 1, the adjustment to PLL circuit 100 is made by the frequency direction signal (FDIR) sent via output 152 and the frequency adjust signal (FAD J) sent via output 148. The FDIR and FADJ signals are sent to MUX 134. Mux 134 in turn provides an adjustment signal via output 160 to divider 126. This provides an instant phase correction which realigns recovered clock output 170 to the incoming received data so that further frequency error accumulation in register 206 is based on long term frequency offset error as opposed to a slowly corrected phase error. These simultaneous adjustments prevent oscillation or ringing of the frequency offset accumulator 216 and provides the capability of tracking clock drift in the CPP or CFP in a stable manner. Frequency error accumulator 206 and comparator 204 act as a second adjustment means for circuit 200.

Decode logic 208 which provides the FDIR and FADJ signals provides a method by which the frequency offset adjustment and the frequency error adjustments can be multiplexed to PLL circuit 100. The decode circuit also provides for multiple adjustments where both the output of comparator 204 and the carry-out output 228 signals are valid at the same time. All the calculations and adjustments done by frequency correction circuit 200 control the adjustments done to PLL circuit 100, with all the information handled at the end of each receive frame.

An example of frequency offset at worst case conditions provided by PLL 100 and in particular by frequency correcting circuit 200 is discussed with reference to Table 1. Assuming that the symbol bit rate is equal 72,000 bits-per-second, the symbol bit period is equal to 13.89 μs, and the worst case frequency offset is equal to 150 PPM (parts-per-million, which is equal to 300 ns/transmit+receive frame).

The scenario shown in Table 1 shows how adjustments would be determined on each frame.

TABLE 1

| Time | frequency offset | correction | type of adjustment |
|---|---|---|---|
| 0 | 0 | 0 | no adjust |
| 2.0003mS | 300nS | 0 | no adjust |
| 4.0006mS | 600nS | 434nS | late adjust |
| 6.000466mS | 466nS | 434nS | late adjust |
| 8.000332mS | 332nS | 0 | no adjust |

In this particular scenario, at the end of the 5th frame, the frequency offset accumulator 216 would have a −2 value which correlates to an absolute value of 2 in the late direction. Since two late adjustments were made above. This scenario would have to be carried out to the full 256 frames of accumulation to be accurate as it is clear from the above calculations that the circuit is not at ⅔rds but at 2/5ths frequency offset. At the end of 256 frames, frequency offset accumulator 216 would have a value of 176. The frequency offset adjustment would look similar to what is shown in Table 2 below. THR (Before) column signifies the value in temporary holding register 226 before the frame number in the leftmost column is received, and the THR(After) column signifies the value in the temporary holding register after the frame is received. The column labeled "Adder" indicates the value in adder 210, while the "Carry Out" column shows when a carry out at output 228 occurs.

TABLE 2

| Frame | THR (Before) | THR (After) | Adder | Carry Out (CO) |
|---|---|---|---|---|
| n | 0 | 176 | 176 | 0 |
| n + 1 | 176 | 97 | 352 | 1 |
| n + 2 | 92 | 13 | 268 | 1 |
| n + 3 | 13 | 189 | 189 | 0 |
| n + 4 | 189 | 110 | 365 | 1 |
| n + 5 | 110 | 21 | 276 | 1 |
| n + 6 | 21 | 197 | 197 | 0 |

As shown in Table 2, the adjustments are made at approximately ⅔rds offset which is what 300 ns/434 ns is equal to. As time continues, the fractional value carried forward which is kept in temporary holding register 226 will remove the difference as much as possible. Eventually, the frequency error will accumulate and make an adjustment to correct the error in the calculated offset. The present circuit design distributes the adjustments over time to maintain bit alignment and frequency accuracy.

Figure 3:
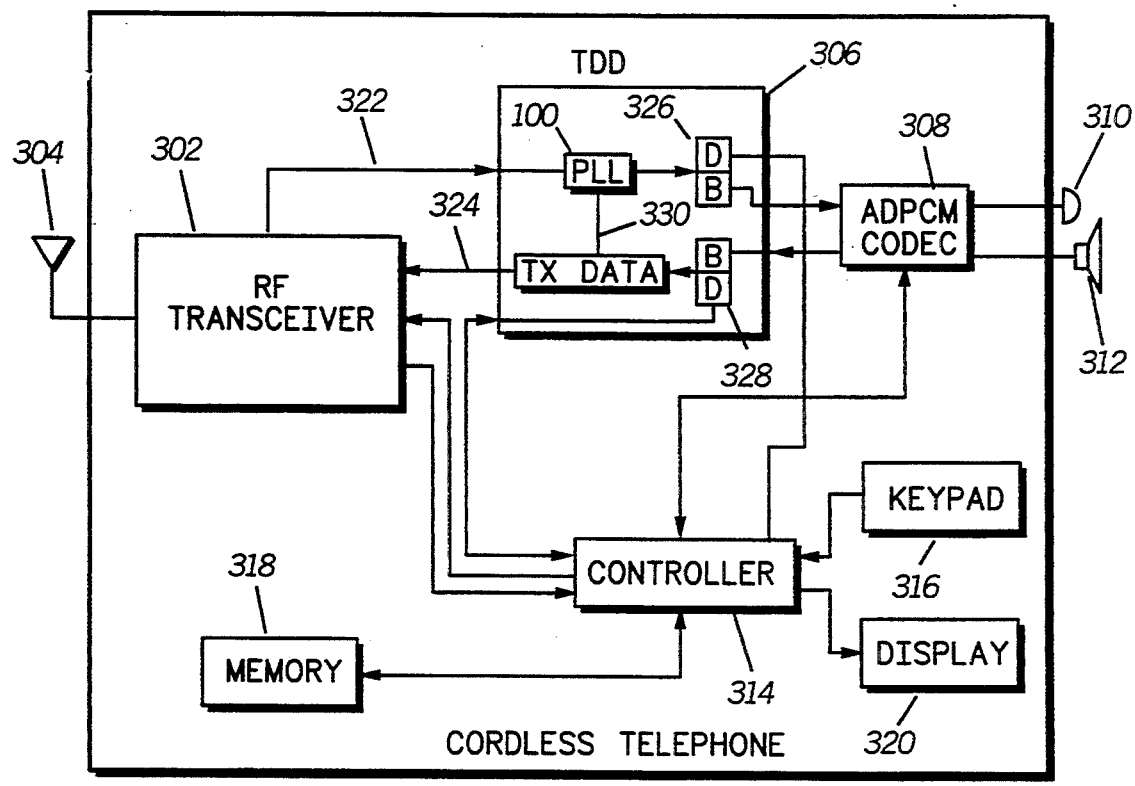
FIG. 3 is a block diagram of a radio in accordance with the present invention.

In FIG. 3, a simplified block diagram of a radio such as a cordless telephone 300 in accordance with the present invention is shown. Cordless telephone 300 comprises a well known RF transceiver 302 for transmitting and receiving RF communication signals via an antenna 304. CT2 handsets operate in accordance with the previously mentioned "MPT1375 Common Air Interface Specification" (CAI) which establishes a time-division duplex protocol having alternating one millisecond receive and transmit frames separated by guard time segments. In one multiplexing scheme, each transmit/receive segment includes a B channel (64 bits) and a D channel which contains 1 or 2 bits at each end of the B channel.

A time division duplexer (TDD) 306 is coupled to transceiver 302 for providing time-division-duplexing and receive/transmit framing of the digital signals. An ADPCM/CODEC 308 receives voice signals generated by a microphone 310 and processes them for transmission. The APCM/CODEC 308 also provides voice signals to be rendered audible via speaker 312. A microphone 310 receives voice signals and transfers them to the ADPCM/CODEC 308 which sets the information into a digital format for transmission.

A control means such as controller 314 provides operational control for the cordless telephone 300. Controller 314 can be any one of a number of microprocessors or microcontrollers, the controller preferably includes input/output capabilities and built-in memory. Controller 314 automatically modifies such communication protocol parameters such as which MUX level to use, what information packets to send, as well as other parameters which are required for telephone 300 to emulate in order for it to be able to communicate directly with other telephones, while still allowing telephone 300 to maintain compliance with the CT2 communication protocol standard (CAI).

A telephone user interacts with cordless telephone 300 via keypad 316. Keypad 316 allows the device user to enable operational features of the telephone 300 such as request for a base station channel, etc. A display 320 provides visual interaction for the subscriber. A memory block 318 such as an electrically erasable programmable read-only memory (EEPROM), provides storage of the handset's ID number and other important information. Memory block 318 can also include a RAM portion for the temporary storage of program information. The PLL circuit 100 and frequency offset circuit 200 which is part of PLL circuit 100 are included as part of time-division duplexer (TDD) circuit 306. Receive data 322 is sent to TDD 306 while transmit data 324 is sent from TDD 306 to RF transceiver 302. Also part of TDD circuit 306 are registers 326 and 328 which temporary store the D and B channel data. Register 326 stores data in the receive side, while register 328 stores data for the transmit side. Line 330 provides a recovered clock signal from PLL circuit 100 to the transmit data registers in order to synchronize the transmit data.

In summary, the present invention provides for a multimode digital PLL circuit which provides frequency offset correction. Loss of synchronization and interference in communication systems such as present CT2 systems can be eliminated or greatly reduced with the present invention. A unique frequency accumulator is used to maintain a frequency offset history and to control the loop frequency which allows for very narrow band operation of the first order PLL while maintaining stable system operation. The present invention is useful for both wireline and radio frequency (RF) systems.

What is claimed is:

1. A method for providing frequency offset correction to a digital phase-lock-loop which receives data frames each having a plurality of digital bit transitions, comprising the steps of:
    generating a clock signal;
    phase comparing the digital bit transitions found in each of the data frames against the clock signal in order to determine the number of digital bit transitions which are early versus the number of digital bit transitions which are late as compared to the clock signal for each data frame which is received;
    adjusting a first up/down counter after phase comparing each data frame, the first up/down counter is adjusted in value in one direction if the number of digital bit transitions which are early when referenced to the clock signal in a given data frame are greater than the number of digital bit transitions which are late when referenced to the clock signal and the first up/down counter is adjusted in the opposite direction if the number of digital bit transitions which are late are greater than the number of digital bit transitions which are early in a given data frame;
    determining if a first predetermined number of data flames have been received; and
    adjusting the clock signal over a second predetermined number of data frames after determining that the first predetermined number Of data frames have been received using the value stored in the up/down counter wherein the step of adjusting the value in the first up/down counter comprises the steps of:
    phase comparing the digital bit transitions found in each of the data frames during the period the phase detector is receiving the second predetermined number of data flames against the clock signal in order to determine the number of digital bit transitions which are early versus the number of digital bit transitions which are late as compared to the clock signal for each of the data flames which are received;
    adjusting a second up/down counter after phase comparing each data frame against the clock signal during the period the phase detector is receiving the second predetermined number of data flames, the second up/down counter is adjusted in value in one direction if the number of digital bit transitions which are early in a given data frame is greater than the number of digital bit transitions which are late and in the opposite direction if the number of digital bit transitions which are late is greater than the number of digital bit transitions which are early;
    comparing the value stored in the second up/down counter to a frequency error threshold value after each data frame is received; and
    adjusting the value in the first up/down counter if the value in the second up/down counter has reached the value of the frequency error threshold.

2. A method as defined in claim 1, wherein the step of generating a recovered clock signal, comprises the steps of:
    generating a reference frequency signal; and
    frequency dividing said reference frequency signal by a selected one of a plurality of divisors in order to produce the clock signal.

3. A method as defined in claim 1, wherein the step of adjusting the clock signal, comprises the steps of:
    adding the value stored in the first up/down counter to the value stored in a register which is initialized to zero;
    determining if a carry-out is generated during the adding step; and
    generating a correction signal if a carry-out is generated which causes the clock signal to change in frequency.

4. A method as defined in claim 3, further comprising the step of:
    adjusting the value in the first up/down counter during the period the phase-lock-loop is receiving the second predetermined number of data frames.

5. A method as defined in claim 1, comprising the further step of:

adjusting the frequency of the clock signal if the value in the second up/down counter has reached the value of the frequency error threshold.

6. A method as defined in claim 5, comprising the further step of:
resetting the value in the second up/down counter to zero after adjusting the frequency of the clock signal.

7. A digital phase-lock-loop which receives digital bit transitions formatted into data flames, comprising:
a clock means for providing a clock signal;
a phase detector means coupled to the clock means for phase comparing the digital bit transitions found in each of the data frames against the clock signal in order to determine the number of digital bit transitions which are early versus the number of digital bit transitions which are late as compared to the clock signal;
a first counter means coupled to the phase detector means, the first counter means is adjusted in value in one direction if the number of digital bit transitions which are early referenced to the clock signal in a given data frame are greater than the number of digital bit transitions which are late and is adjusted in the opposite direction if the number of digital bit transitions which are late referenced to the clock signal are greater than the number of digital bit transitions which are early;
a data frame counter means coupled to the phase detector means for determining if a first predetermined number of data flames have been received, said data frame counter means generating a signal after determining that the first predetermined number of data frames have been received;
adjustment means coupled to the clock means, the data frame counter means, and including the first counter means for adjusting in response to receiving the signal generated by the data frame counter means the clock signal over a second predetermined number of data frames using the value stored in the first counter means; and
a second adjustment means coupled to the first counter means, the data frame counter means, and the phase detector means for adjusting the first counter means in the one or opposite direction during the period the phase-lock-loop is receiving the second predetermined number of data flames.

8. A digital phase-lock-loop as defined in claim 7, wherein the second adjustment means comprises:
a second counter means coupled to the phase detector means, the second counter means is adjusted after phase comparing the digital bit transitions in each data frame against the clock signal during the period the phase detector is receiving the second predetermined number of data frames, the second counter means is adjusted in value in one direction if the number of digital bit transitions which are early referenced to the clock signal in a given data frame is greater than the number of digital bit transitions which are late referenced to the clock signal and is adjusted in the opposite direction if the number of digital bit transitions which are late are greater than the number of digital bit transitions which are early in a given data frame; and
a comparison means coupled to the second counter means for comparing the value stored in the second counter means to a frequency error threshold value after each data frame is received.

9. A digital phase-lock-loop as defined in claim 8, further comprising:
a frequency adjustment circuit coupled to the clock means and the comparison means for adjusting the frequency of the clock signal if the value in the second counter means has reached the value of the frequency error threshold.

10. A communication device, comprising
a transmitter: and
a receiver including:
a digital phase-lock-loop which receives digital bit transitions formatted into data frames, the digital phase-lock-loop is coupled to the receiver, the digital phase-lock-loop comprising:
a clock for providing a clock signal;
a phase detector coupled to the clock for phase comparing the digital bit transitions found in each of the data frames against the clock signal in order to determine the number of digital bit transition, which are early when referenced to the clock signal versus the number of digital bit transitions which are late when referenced to the clock signal;
a first counter coupled to the phase detector, the first counter is adjusted in value in one direction if the number of digital bit transitions which are early referenced to the clock signal in a given data frame is greater than the number of digital bit transitions which are late referenced to the clock signal and is adjusted in value in the opposite direction if the number of digital bit transitions which are late are greater than the number of digital bit transitions which are early in a given data frame;
data frame counter coupled to the phase detector for determining if a first predetermined number of data frames have been received, said data frame counter generating a sisal after determining tat the first predetermined number of data frames have been received, the data frame counter also determines when the second predetermined number of data flames are being received;
adjustment means coupled to the clock and the data frame counter, and including the first counter for adjusting the clock signal over a second predetermined number of data flames in response to receiving the signal generated by the data frame counter using the value stored in the first counter; and
a second adjustment means coupled to the first counter, the data frame counter, and the phase detector for adjusting the first counter in the one or opposite direction during the period the digital phase-lock-loop is receiving the second predetermined number of data flames.

11. A communication device as defined in claim 10, wherein the communication device is a cordless telephone.

12. A communication device as defined in claim 10, wherein the communication device is a time-domain-duplex (TDD) radio.

13. A communication device as defined in claim 10, wherein the second adjustment means comprises:
a second counter coupled to the phase detector, the second counter is adjusted after phase comparing the digital bit transitions in each data frame against the clock signal during the period the phase detector is receiving the second predetermined number of data frames, the second counter is adjusted in value in one direction if the number of digital bit transitions which are early in a given data frame is greater than the number of digital bit transitions which are late and is adjusted in the opposite direction if the number of digital bit transitions which are late are greater than the number of digital bit transitions which are early in a given data frame; and a comparison means coupled to the second counter for comparing the value stored in the second counter to a frequency error threshold value after each data frame is received.

* * * * *

UNITED STATES PATENT AND TRADEMARK OFFICE
CERTIFICATE OF CORRECTION

PATENT NO. : 5,436,937
DATED : July 25, 1995
INVENTOR(S) : Brown et al.

It is certified that error appears in the above-indentified patent and that said Letters Patent is hereby corrected as shown below:

At column 10, lines 21 and 30; column 11, lines 10, 31, and 47; and column 12, lines 42, 47 and 56; please replace "flames" with --frames--.

At column 12, line 38, please replace "sisal" with --signal--.

At column 12, line 39, please replace "tat" with --that--.

Signed and Sealed this

Twenty-sixth Day of December, 1995

Attest:

BRUCE LEHMAN

*Attesting Officer*　　　　*Commissioner of Patents and Trademarks*